United States Patent
Zhang et al.

(10) Patent No.: US 8,138,845 B1
(45) Date of Patent: Mar. 20, 2012

(54) METHOD AND APPARATUS FOR AUTO-FREQUENCY CALIBRATION FOR MULTI-BAND VCO

(75) Inventors: Yu Zhang, Shanghai (CN); Liang Zhang, Shanghai (CN); Yong Wang, Shanghai (CN); Xin Liu, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 177 days.

(21) Appl. No.: 12/561,039

(22) Filed: Sep. 16, 2009

(51) Int. Cl.
*H03B 5/12* (2006.01)

(52) U.S. Cl. ............... 331/117 FE; 331/167; 331/117 R

(58) Field of Classification Search ............ 331/117 FE, 331/117 R, 167
See application file for complete search history.

(56) References Cited

U.S. PATENT DOCUMENTS

| 7,477,113 B1 * | 1/2009 | Hughes ............ 331/177 V |
| 2009/0302958 A1 * | 12/2009 | Sakurai et al. ............ 331/1 A |
| 2009/0322436 A1 * | 12/2009 | Hosoya et al. .......... 331/117 FE |

* cited by examiner

*Primary Examiner* — Joseph Chang
(74) *Attorney, Agent, or Firm* — Heimlich Law, PC; Adam Heimlich, Esq.

(57) ABSTRACT

A method and apparatus for auto-frequency calibration for multi-band VCO have been disclosed where a VCO is first adjusted to a major frequency band and then adjusted to a sub-band within the major frequency band.

20 Claims, 7 Drawing Sheets

US 8,138,845 B1

METHOD AND APPARATUS FOR AUTO-FREQUENCY CALIBRATION FOR MULTI-BAND VCO

FIELD OF THE INVENTION

The present invention pertains to current Voltage Controlled Oscillators (VCO). More particularly, the present invention relates to a method and apparatus for auto-frequency calibration for multi-band VCO.

BACKGROUND OF THE INVENTION

In recent years, wideband high performance synthesizers have been widely employed in various applications, most of which are implemented with a multi-band VCO to cover a wide frequency range, as shown, for example, generally at 300 in FIG. 3. However, if the frequency range needed to be covered is ultra-wide, a large number of sub-bands is indispensable. Such a large number of sub-bands may cause larger parasitic capacitance, larger VCO tuning gain deviation for different tuning sub-band, a worse mismatch problem, and longer time consumed for a band selection algorithm. The large parasitic capacitance is generally unacceptable in high frequency applications. The mismatch due to complex interconnection degrades the symmetric property of the VCO, which may up-convert much more flicker noise from the bias circuits and the power supply to the output. This is absolutely undesirable, of course. If a smaller number of sub-bands are used, the VCO gain has to be increased to cover the same frequency range. This unavoidable trade-off makes designers frustrated all the time. Thus current techniques present problems.

BRIEF DESCRIPTION OF THE DRAWINGS

The invention is illustrated by way of example and not limitation in the figures of the accompanying drawings in which.

SUMMARY OF THE INVENTION

A method and apparatus for auto-frequency calibration for multi-band VCO is disclosed. In one approach an apparatus using a course tuning bank and a fine tuning bank are disclosed. These and other embodiments of the present invention are described in the writings and drawings herewith.

DETAILED DESCRIPTION

In one embodiment of the invention, a novel auto-frequency calibration (AFC) technique for multi-band VCO, which is especially effective in ultra-wide band synthesizers, is presented. One advantage of this technique is that this method decouples the trade-off between the number of sub-band and the VCO tuning gain.

Figure 3:
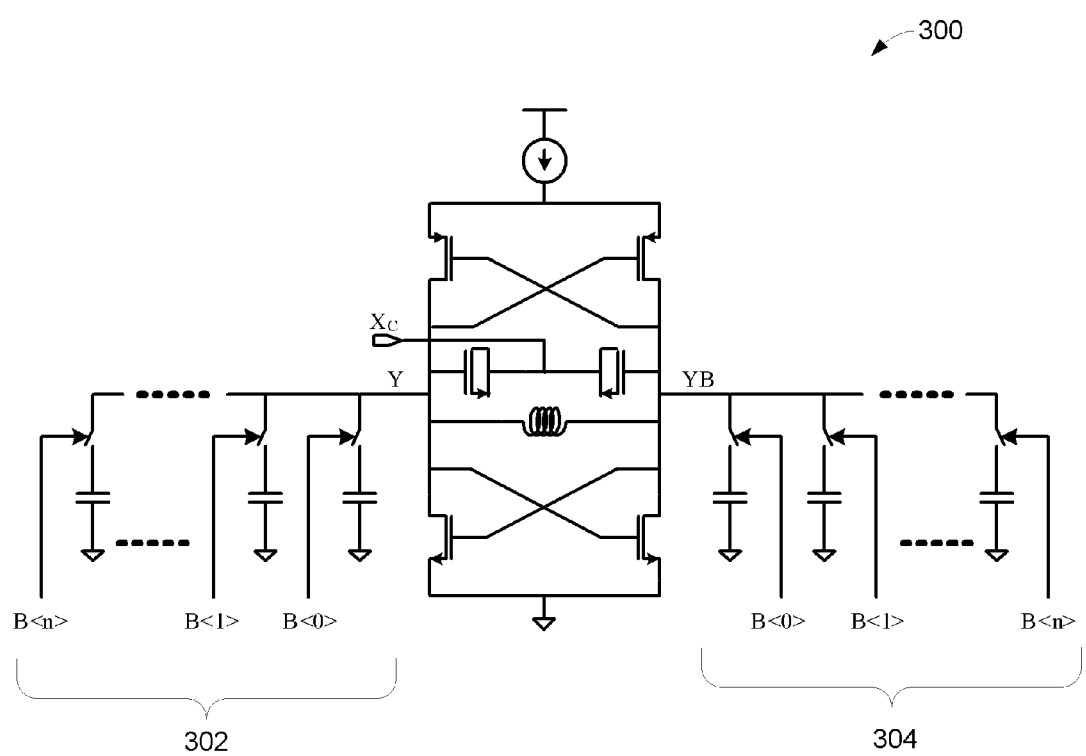
FIG. 3 illustrates a prior approach.
Figure 4:
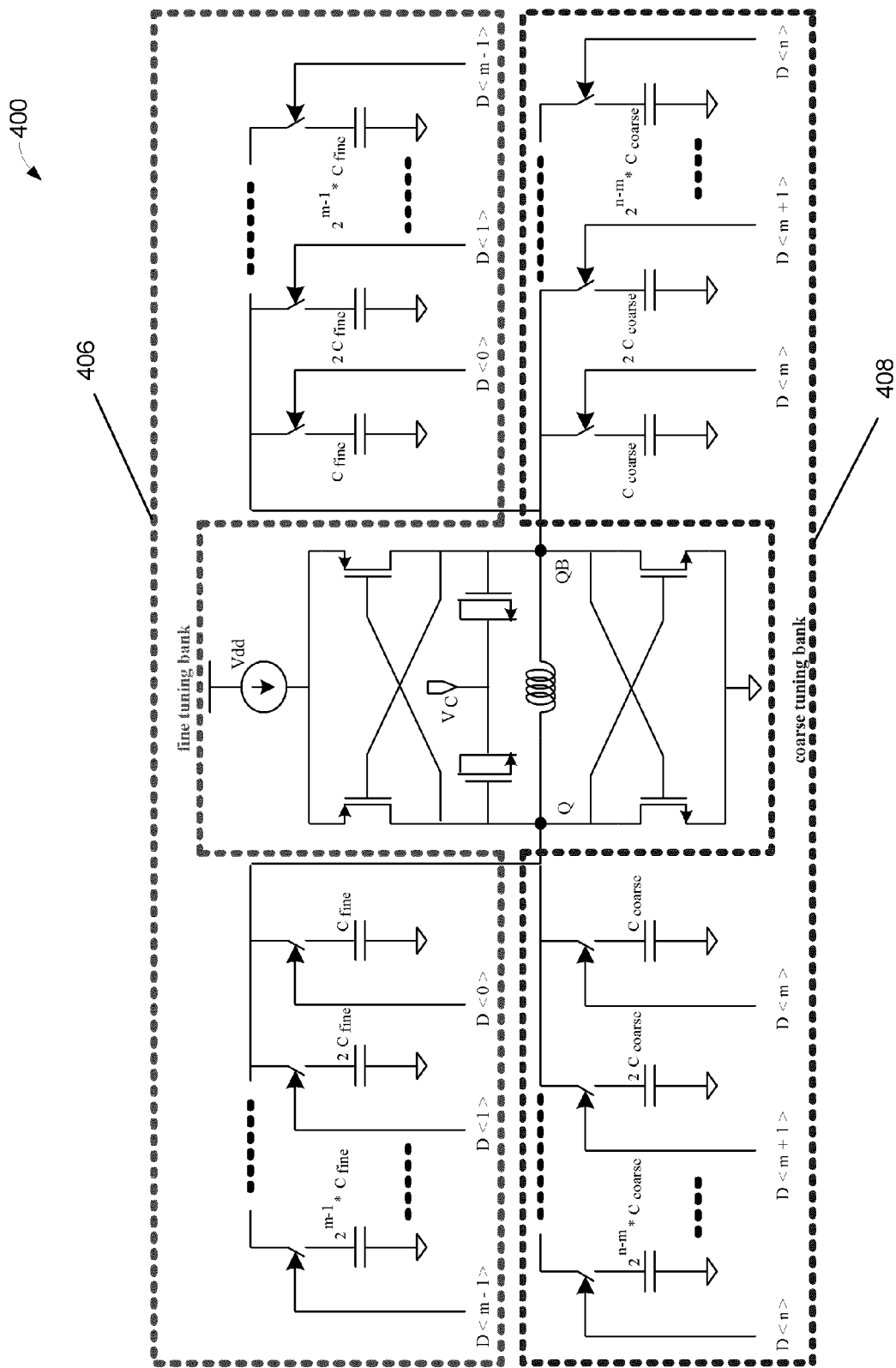
FIG. 4 illustrates one embodiment of topology for the invention.

FIG. 4 illustrates, generally at 400, one embodiment of the invention showing a circuit topology. A whole capacitor bank (such as that shown in FIG. 3 at 302 and 304) is separated into a fine tuning bank and a coarse tuning bank (both shown in FIG. 4 at 406 and 408 respectively). The minimum capacitor unit is $C_{fine}$ and $C_{coarse}$ in the fine tuning bank and the coarse tuning bank respectively. The coarse tuning bank is controlled by MSB (most significant bits) of the digital control word (D<m:n>, here m<n) and the fine tuning bank is controlled by LSB (least significant bits) of the digital control word (D<0:m−1>). And $C_{fine}$ is generally much smaller than $C_{coarse}$.

In operation, once the divider ratio of the synthesizer has been changed, the VCO should have to oscillate at a new frequency point and the working band of the VCO may have to be selected once again by means of an AFC procedure.

For example, we will use FIG. 4 and illustrate its working mechanism in detail, via the example given here. We choose m=5 and n=8 in this example. Thus the coarse tuning bank has $2^{n-m+1}=16$ kinds of different states and the fine tuning bank has $2^{m-1}=32$ kinds of different states. The 16 different states of the coarse tuning bank means the whole tuning range is divided into 16 frequency regions equally. Given, for example, the whole frequency tuning range of the VCO being 1 GHz, then each region occupies 1 GHz/16=62.5 MHz frequency range, such as is shown as the left part in FIG. 5 (at 502 and 504 respectively).

Figure 5:
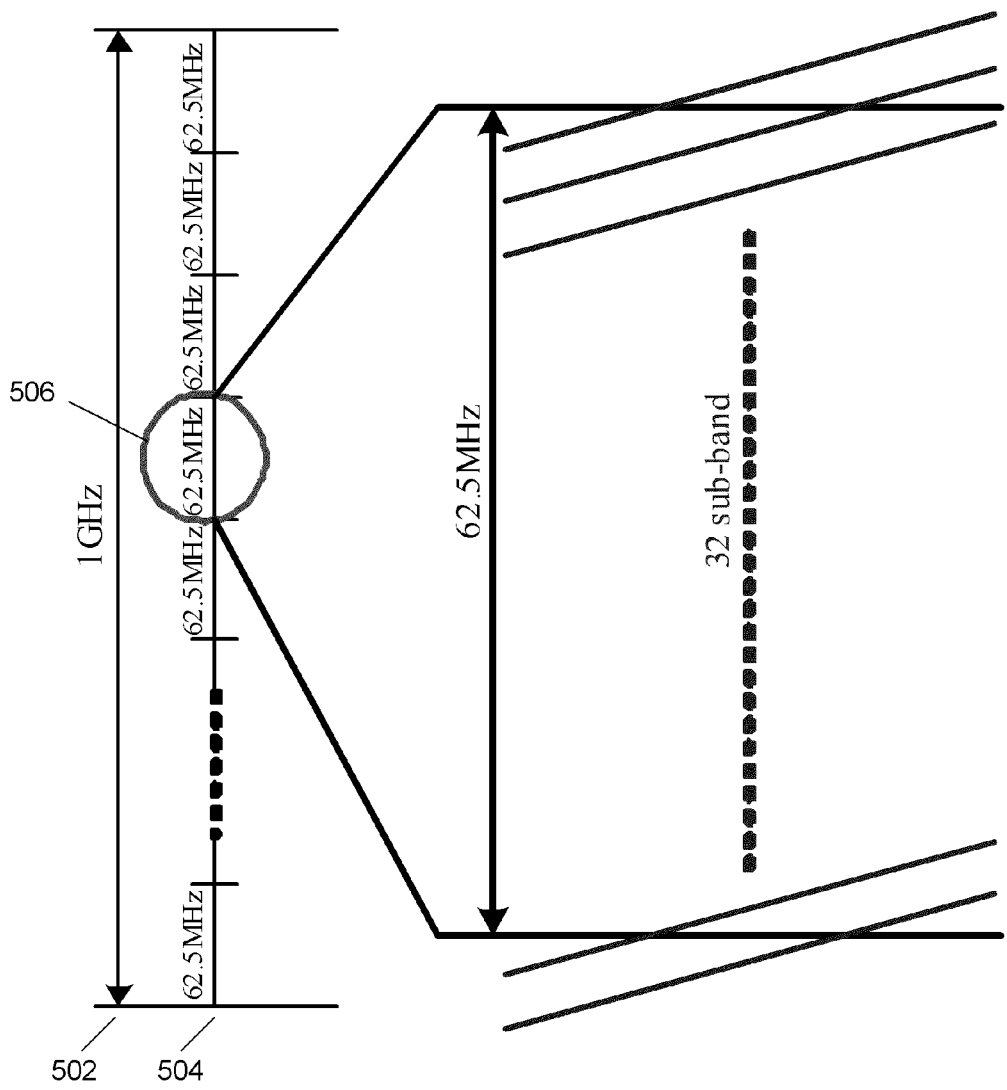
FIG. 5 illustrates one embodiment of frequency division for the invention.
Figure 6:
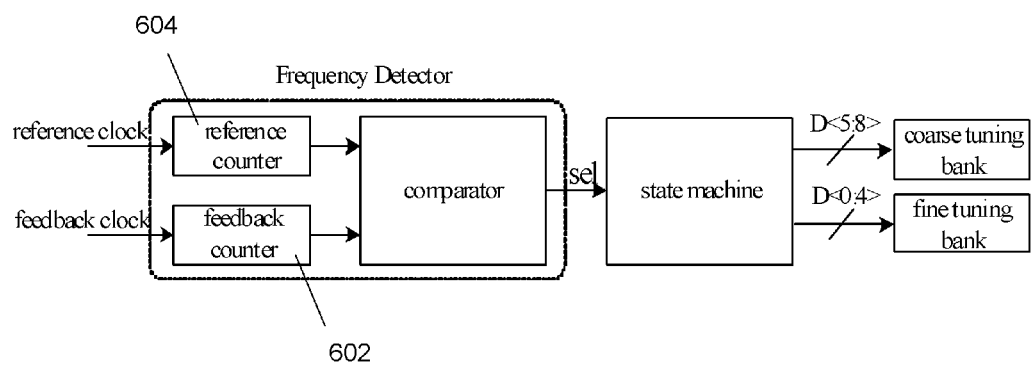
FIG. 6 illustrates one embodiment of the invention showing auto-frequency control in block diagram form.

The AFC, in one embodiment, can be done in two steps, while the $V_C$ is forced at Vdd/2 before the AFC has been completed. In the first step, the feedback counter and the reference counter (both shown, for example, in FIG. 6 at 602 and 604 respectively) counts the cycles of the feedback clock and reference clock respectively. By comparing the counted value and tuning the control word of the coarse tuning bank (D<5:8>), we would know the target frequency point is located in which one of the 16 frequency regions (in our example, it locates in the region with the ellipse at 506, as shown in FIG. 5). By now, the first step has completed and the D<5:8> is fixed. Then in the second step, the comparisons are still made between the reference clock and the feedback clock as done in the first step. But this time, the tuning target is the control word of the fine tuning bank (D<0:4>). Here the 62.5 MHz range is divided into 32 regions. Again, by comparisons, it is easy to determine which one of the 32 small regions the target frequency point belongs to. Then the D<0:4> is fixed and AFC completes. The $V_C$ is released and is controlled by analog synthesizer loop subsequently to achieve analog lock. In this step, the whole tuning range becomes 62.5 MHz. There is only 62.5/32≈2 MHz to be covered for each tuning curve.

The example above is just one embodiment of the invention. One of skill in the art will appreciate that all the parameters could be given any value according to different application requirements.

Figure 7:
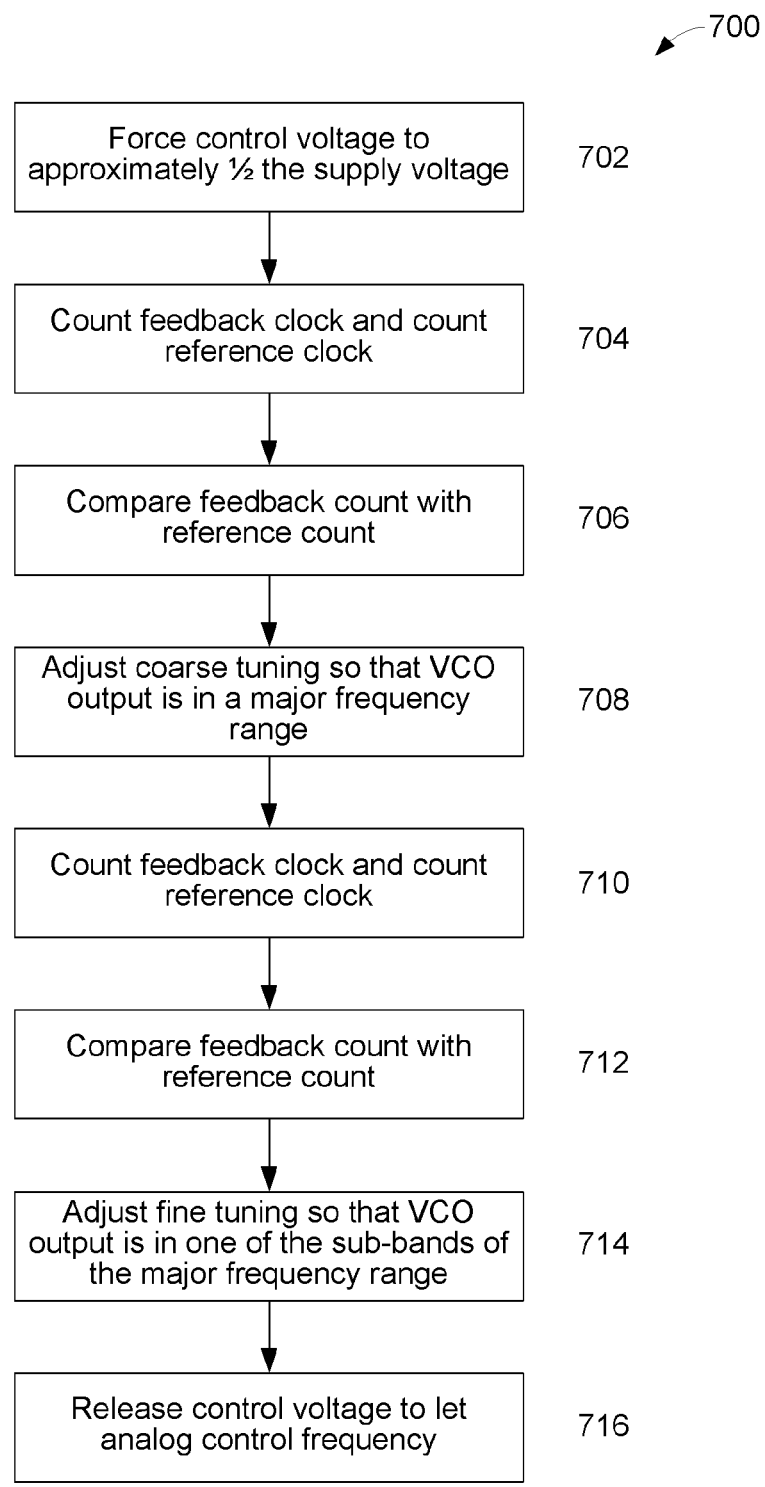
FIG. 7 illustrates one embodiment of the invention in flow chart form.

FIG. 7 illustrates, generally at 700, one embodiment of the invention in flow chart form. At 700 the control voltage is forced to approximately ½ the supply voltage. At 704 the feedback clock is counted and the reference clock is counted. At 706 the feedback count is compared with the reference count and at 708 based on the comparison at 706 the coarse tuning is adjusted so that VCO output is in a major frequency range. At 710 the feedback clock is again counted and the reference clock is again counted. At 712 the feedback count is again compared with the reference count and at 714 based on the comparison at 712 the fine tuning is adjusted so that VCO output is in one of the sub-band of the major frequency range (which was tuned at 708). At 716 the control voltage is released to let the analog circuitry control the frequency and lock the VCO.

The advantage of this technique is that it decouples the trade-off between the number of sub-bands and the VCO tuning gain. A simple comparison is made in this section to illustrate the advantage of the proposed technique. Suppose that the VCO tuning gain $K_{VCO}$=10 MHz/V, charge pump output range $\Delta V_C$=1V, and the required synthesizer output range $\Delta f$=1 GHz. If the traditional way is employed, then the number of total band is $$N_{band} = \frac{\Delta f}{\Delta V_C \times K_{VCO}} = \frac{1000 \text{ MHz}}{1 \times 10 \text{ MHz}} = 100$$

at least. If the current invention is employed, suppose that the number of the coarse tuning bank is $N_{coase}$=16, and each of the 16 frequency regions is $$\Delta f_{fine} = \frac{\Delta f}{N_{coase}} = \frac{1000 \text{ MHz}}{16} = 62.5 \text{ MHz}.$$

Then the number of the fine tuning bank is $$N_{fine} = \frac{\Delta f_{fine}}{\Delta V_c \times K_{VCO}} = \frac{62.5 \text{ MHz}}{1 \times 10 \text{ MHz}} = 6.25 \approx 7.$$

There are only 7 bands in each 16 coarse steps necessary in the current invention, which is much more simplified than the 100 bands required in the traditional method. Additionally, in a fractional-N synthesizer, the linearity of the synthesizer loop is of great importance. Only the most linear region of the charge pump should be chosen, $\Delta V_C$=0.5V for example. And using the same calculation as above. Then more than 200 bands are required for the traditional method. But for the current invention, only 14 bands in each 16 coarse steps are necessary. Hence a wide-band high linearity fractional-N synthesizer feasible by applying the current invention.

One of skill in the art will understand that the current invention has simplified the capacitor bank to a large extent. The parasitic capacitance is decreased, the mismatching problem is attenuated, and the AFC time is decreased. These advantages are all a benefit from the simple capacitor tuning bank. Additionally, the linearity of the synthesizer loop can more easily be improved.

Thus a method and apparatus for auto-frequency calibration for multi-band VCO have been described.

Figure 1:
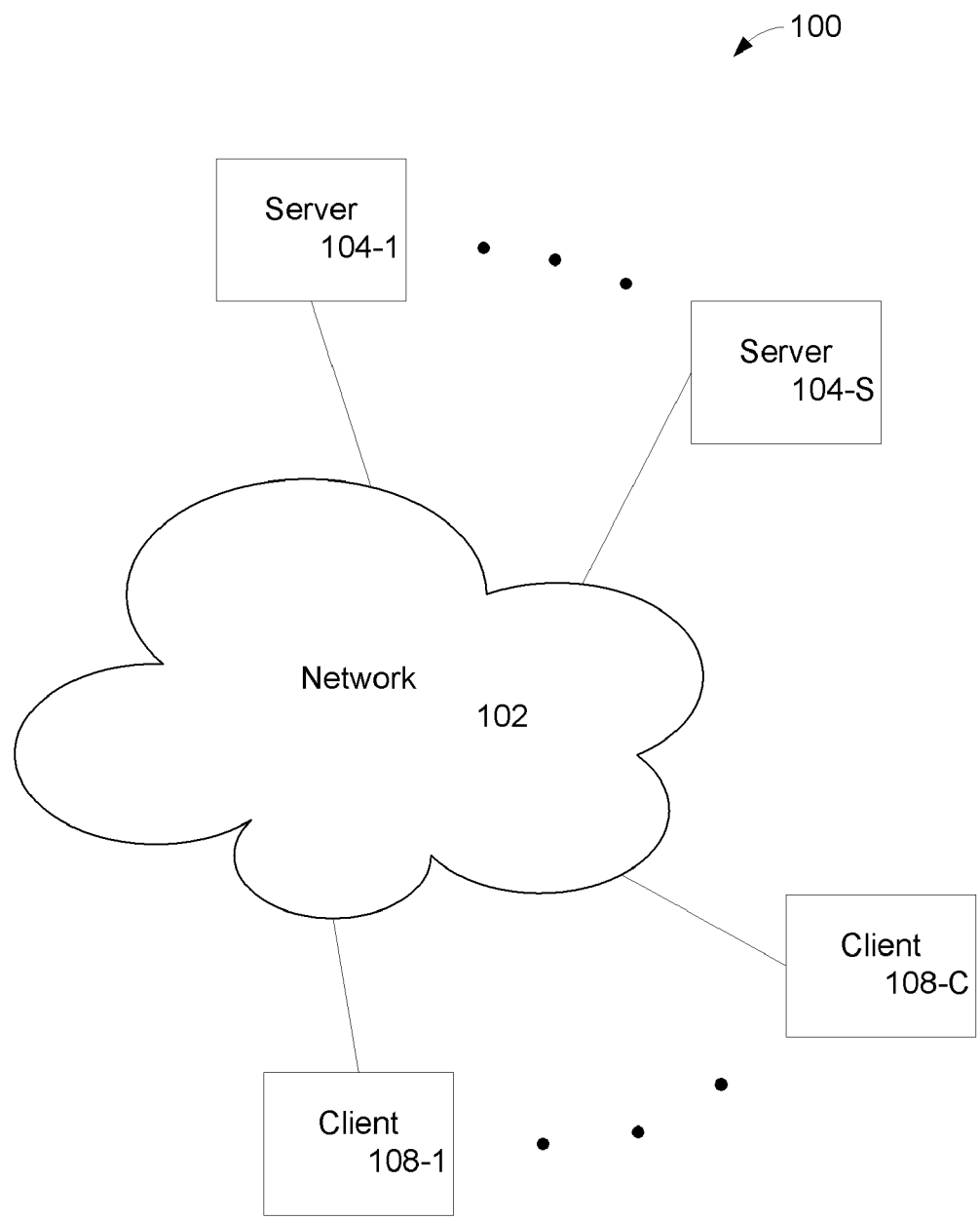
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
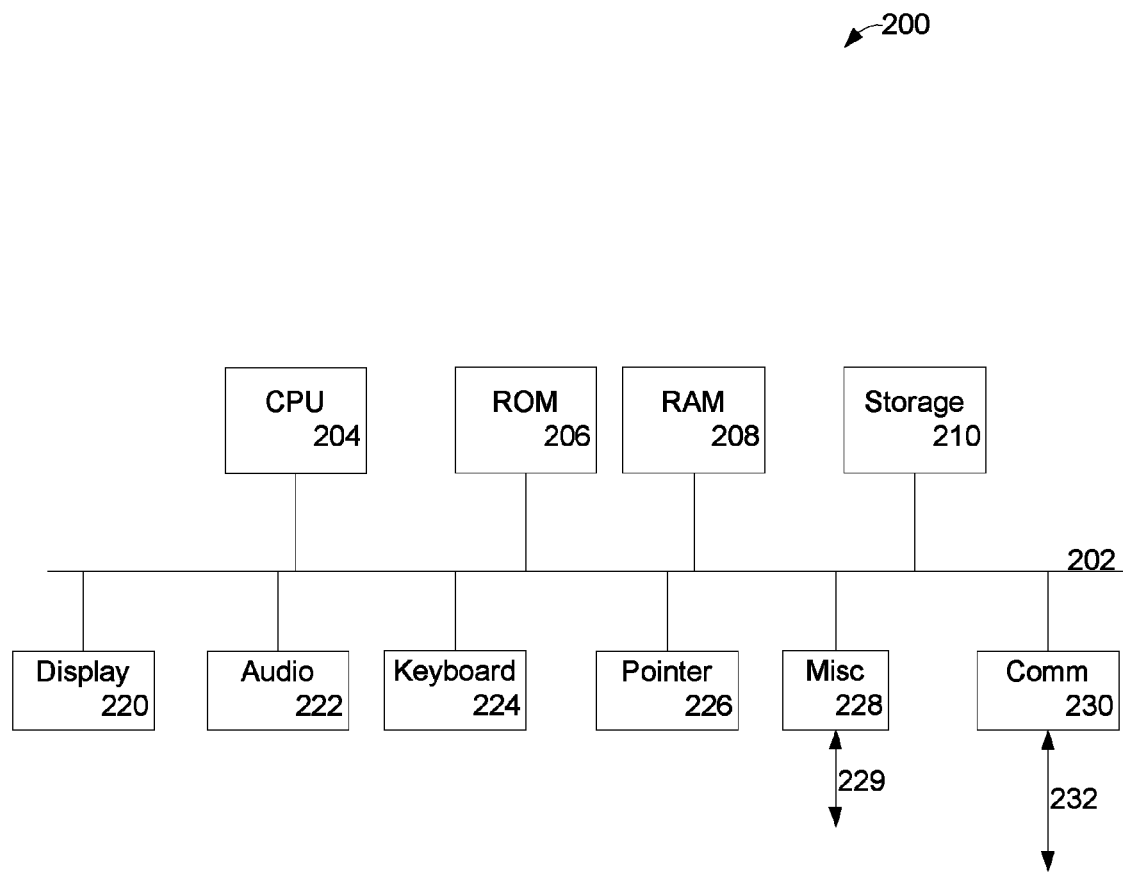
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote, such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Various spellings may be used for terms used in the description. These variations are to be understood to relate to the same term unless denoted otherwise. For example: failsafe is also spelled fail safe, and failsafe; start-up is also spelled startup, and start up; subthreshold is also spelled sub-threshold, and sub threshold; etc.

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals which upon reception causes movement in matter (e.g. electrons, atoms, etc.) (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

As used in this description, "substantially" or "substantially equal" or similar phrases are used to indicate that the items are very close or similar. Since two physical entities can never be exactly equal, a phrase such as "substantially equal" is used to indicate that they are for all practical purposes equal.

It is to be understood that in any one or more embodiments of the invention where alternative approaches or techniques are discussed that any and all such combinations as my be possible are hereby disclosed. For example, if there are five techniques discussed that are all possible, then denoting each technique as follows: A, B, C, D, E, each technique may be either present or not present with every other technique, thus yielding 2^5 or 32 combinations, in binary order ranging from not A and not B and not C and not D and not E to A and B and C and D and E. Applicant(s) hereby claims all such possible combinations. Applicant(s) hereby submit that the foregoing combinations comply with applicable EP (European Patent) standards. No preference is given any combination.

Thus a method and apparatus for auto-frequency calibration for multi-band VCO have been described.

What is claimed is:

1. An apparatus comprising:
   a voltage controlled oscillator (VCO) having an output (Q) and an inverted output (QB);
   a first bank of switchable capacitors coupled to said Q and connected to a common point (E);
   a second bank of switchable capacitors coupled to said QB and connected to said E;
   a third bank of switchable capacitors coupled to said Q and connected to said E;
   a fourth bank of switchable capacitors coupled to said QB and connected to said E;
   a first set of control signals coupled to said first bank of switchable capacitors and coupled to said second bank of switchable capacitors; and
   a second set of control signals coupled to said third bank of switchable capacitors and coupled to said fourth bank of switchable capacitors, wherein said second set of control signals are different than said first set of control signals.

2. The apparatus of claim 1 wherein said first bank of switchable capacitors and said second bank of switchable capacitors are substantially the same respective capacitance.

3. The apparatus of claim 2 wherein said third bank of switchable capacitors and said fourth bank of switchable capacitors are substantially the same respective capacitance.

4. The apparatus of claim 1 where said first bank of switchable capacitors (c) comprises j capacitors (c1, c2, ..., cj) and wherein each of said j capacitors capacitance (x) is related as follows: $c1=x, c2=2x, \ldots, cj=2^{j-1}x$.

5. The apparatus of claim 4 where said second bank of switchable capacitors (e) comprises k capacitors (e1, e2, ..., ek) and wherein each of said k capacitors capacitance (u) is related as follows: $e1=u, e2=2u, \ldots, ek=2^{k-1}u$.

6. The apparatus of claim 5 where said third bank of switchable capacitors (f) comprises o capacitors (f1, f2, ..., fo) and wherein each of said o capacitors capacitance (v) is related as follows: $f1=v, f2=2v, \ldots, fo=2^{o-1}v$.

7. The apparatus of claim 6 where said fourth bank of switchable capacitors (g) comprises p capacitors (g1, g2, ..., gp) and wherein each of said p capacitors capacitance (w) is related as follows: $g1=w, g2=2w, \ldots, gp=2^{p-1}w$.

8. The apparatus of claim 7 wherein said capacitance x and said capacitance u are substantially equal.

9. The apparatus of claim 8 wherein said capacitance v and said capacitance w are substantially equal.

10. The apparatus of claim 9 wherein said capacitance x is less than said capacitance v.

11. A method comprising:
    forcing a control voltage to approximately one-half a supply voltage;
    counting a feedback clock and generating a first feedback clock count;
    counting a reference clock and generating a first reference clock count;
    comparing said first feedback clock count and said first reference clock count and generating a first control signal;
    adjusting a coarse tuning based on said first control signal;
    counting said feedback clock and generating a second feedback clock count;
    counting said reference clock and generating a second reference clock count;
    comparing said second feedback clock count and said second reference clock count and generating a second control signal;
    adjusting a fine tuning based on said second control signal; and
    releasing said control voltage.

12. The method of claim 11 wherein said adjusting is done via digital signals of width rr.

13. The method of claim 12 wherein said adjusting a coarse tuning based on said first control signal is xx most significant bits of width rr and wherein said adjusting a fine tuning based on said second control signal is rr-xx least significant bits of width rr.

14. The method of claim 13 further comprising coupling said digital signals of width rr to a plurality of 4*rr switching transistors.

15. The method of claim 14 wherein said 4*rr switching transistors can selectively couple a first set of 2*rr capacitors to a first output of a VCO and second set of 2*rr capacitors to a second output of said VCO.

16. The method of claim 15 wherein said first set of 2*rr capacitors and said second set of 2*rr capacitors are respectively of equal capacitance and wherein said first output of said VCO and second output of said VCO are substantially inverted versions of each other.

17. A method comprising:
    dividing an operating frequency range of a VCO into qq discreet major frequency bands by selectively coupling a first plurality of capacitors to a first output of said VCO and a common point (E) and by selectively coupling a second plurality of capacitors to a second output of said VCO and said E; and
    dividing each of said qq discreet major frequency bands into ss sub-bands by selectively coupling a third plurality of capacitors to said first output of said VCO and said E and by selectively coupling a fourth plurality of capacitors to said second output of said VCO and said E, and wherein said selectively coupling said first plurality of capacitors and said selectively coupling said second plurality of capacitors are independent of said selectively coupling said third plurality of capacitors and said selectively coupling said fourth plurality or capacitors.

18. The method of claim 17 wherein said selectively coupling said first plurality of capacitors and selectively coupling said second plurality of capacitors are done substantially at a first same time.

19. The method of claim 18 wherein said selectively coupling said third plurality of capacitors and selectively coupling said fourth plurality of capacitors are done substantially at a second same time.

20. The method of claim 19 wherein said second same time is after said first same time.

* * * * *